(12) United States Patent
Kaltenback et al.

(10) Patent No.: US 9,043,673 B2
(45) Date of Patent: May 26, 2015

(54) TECHNIQUES FOR REUSING COMPONENTS OF A LOGICAL OPERATIONS FUNCTIONAL BLOCK AS AN ERROR CORRECTION CODE CORRECTION UNIT

(71) Applicant: INTERNATIONAL BUSINESS MACHINES CORPORATION, Armonk, NY (US)

(72) Inventors: Markus Kaltenback, Boeblingen (DE); Jens Leenstra, Boeblingen (DE); Philipp Oehler, Boeblingen (DE); Philipp Panitz, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 13/775,353

(22) Filed: Feb. 25, 2013

(65) Prior Publication Data

US 2013/0227375 A1    Aug. 29, 2013

(30) Foreign Application Priority Data

Feb. 23, 2012    (EP) .................................... 12156619

(51) Int. Cl.
*H03M 13/00*    (2006.01)
*H03M 13/05*    (2006.01)

(52) U.S. Cl.
CPC .................................... *H03M 13/05* (2013.01)

(58) Field of Classification Search
CPC ........................................................ H03M 13/05
USPC ...................................................... 714/30, 759
See application file for complete search history.

(56) References Cited

U.S. PATENT DOCUMENTS

| | | | |
|---|---|---|---|
| 6,934,903 B1 | 8/2005 | Keltcher et al. | |
| 2002/0062462 A1* | 5/2002 | Ohwada | 714/30 |
| 2011/0154157 A1 | 6/2011 | Naeimi | |

* cited by examiner

*Primary Examiner* — Sam Rizk
(74) *Attorney, Agent, or Firm* — Yudell Isidore PLLC; Steven L Bennett

(57) ABSTRACT

A logical operations functional block for an execution unit of a processor includes a first input data link for a first operand and a second input data link for a second operand. The execution unit includes a register connected to an error correction code detection unit. The logical operations functional block includes a look-up table configured to receive an error correction code syndrome from the error correction code detection unit. The logical operations functional block also includes a multiplexer configured to receive an output signal from the look-up table at a first input and the first operand at a second input, wherein an output of the multiplexer is coupled to the first input data link of a logical functional unit.

20 Claims, 5 Drawing Sheets

US 9,043,673 B2

TECHNIQUES FOR REUSING COMPONENTS OF A LOGICAL OPERATIONS FUNCTIONAL BLOCK AS AN ERROR CORRECTION CODE CORRECTION UNIT

This application claims priority to European Patent Application No. EP12156619, entitled "LOGICAL OPERATIONS FUNCTIONAL BLOCK AS ECC CORRECTION UNIT," filed Feb. 23, 2012, the disclosure of which is hereby incorporated herein by reference it its entirety for all purposes.

BACKGROUND

The present invention generally relates to reuse of a logical operations functional block in an execution unit of a processor.

Processors, e.g., microprocessors, are commonly known in the information technology industry. Today, practically all processors are compliant with the von-Neumann architecture and have similar functional blocks. Most processors include a load-store unit, a fixed-point unit, a floating-point unit, and a vector unit. Additionally, and as part of an execution unit, a set of registers may be present in a processor. A processor may include several general purpose registers. A floating-point unit may include a vector register file that may be a continuous bank of registers that may be accessed. A register is typically several bits wide, depending on the word size of the processor. Today, typical word sizes are 32, 64, and also 128 bits. Due to several factors, the content of some of the registers may change unintentionally and, thus, contain a "wrong" bit sequence. A wrong bit in a word may be detected by either additional parity bit(s) stored together with a data word or other error correction code (ECC) information. Moreover, the location of the bit error within a data word may be detected by an ECC and may then be corrected. In general, known techniques utilize special hardware for bit error correction or rely on calling complex microcode subroutines that also employ special hardware components for bit error correction. The wrong bits, e.g., soft errors, in a register may be produced by noise on the data-lines and/or word-lines (or other lines within the processor) or may be produced by random alpha particles striking a circuit within a processor.

In general, ECC correction units are known. For example, U.S. Patent Application Publication No. 2011/0154157 discloses a method for generating hybrid error correction code for a data block. The hybrid code, which may be a residual arithmetic Hammer code, includes a first residual code (based on a data block), a first parity code (based on the data block), and a Hammering matrix. The generated code, along with the data block, can then be communicated through at least a portion of a data-path of a processor. As another example, U.S. Pat. No. 6,934,903 discloses an apparatus that may include an ECC check circuit configured to detect an ECC error in response to an access to first data in a memory and a microcode unit. The microcode unit receives an indication that the ECC check circuit has detected an ECC error. In response to the indication, the microcode unit is configured to dispatch a microcode routine stored in the microcode unit.

BRIEF SUMMARY

A logical operations functional block for an execution unit of a processor includes a first input data link for a first operand and a second input data link for a second operand. The execution unit includes a register connected to an error correction code detection unit. The logical operations functional block includes a look-up table configured to receive an error correction code syndrome from the error correction code detection unit. The logical operations functional block also includes a multiplexer configured to receive an output signal from the look-up table at a first input and the first operand at a second input, wherein an output of the multiplexer is coupled to the first input data link of a logical functional unit.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

The above as well as additional objectives, features, and advantages of the present invention will become apparent in the following detailed written description.

BRIEF DESCRIPTION OF THE DRAWINGS

The description of the illustrative embodiments is to be read in conjunction with the accompanying drawings, wherein.

DETAILED DESCRIPTION

Figure 1:
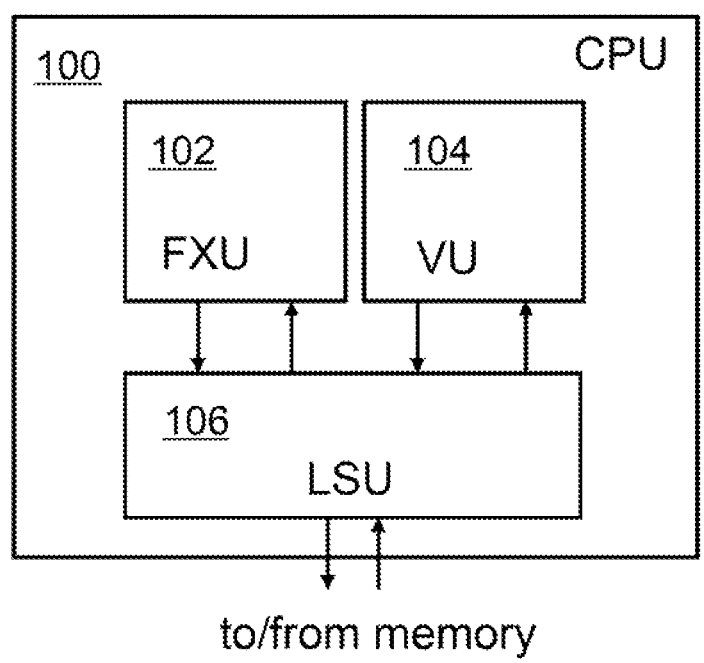
FIG. 1 is a diagram of an exemplary conventional processor core.

The illustrative embodiments provide a logical operations functional block for an execution unit of a processor, a processor, and a method for reusing a logical operations functional block in an execution unit of a processor as an error correction code (ECC) correction unit.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

It is understood that the use of specific component, device, and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized.

According to one embodiment, a logical operations functional block for an execution unit of a processor (e.g., a microprocessor) includes a first input data link for a first operand (va) and a second input data link for a second operand (vb). The execution unit includes a register connected to an error correction code detection unit. The logical operations functional block includes a look-up table (more broadly, a data structure) configured to receive an error correction code syndrome from the error correction code detection unit and a multiplexer configured to receive an output of the look-up table (at a first input) and the first operand (at a second input). An output of the multiplexer is connected to the first input data link of a logical functional unit (e.g., an arithmetic and logic unit (ALU)).

According to another aspect of the invention, a method for reusing an existing logical functional unit (in an execution unit of a processor) for error correction code handling is disclosed. The execution unit includes a register. The method includes generating an error correction logic syndrome as an input for a look-up table (more broadly a data structure). An output of the look-up table provides a first input to a multiplexer. An input data link allocated for the logical functional unit serves as a second input to the multiplexer. An output of the multiplexer provides an input for a logical functional unit (e.g., an arithmetic and logic unit (ALU)). The logical operations functional block may, for example, be an existing logical operations functional block, e.g., an ALU of a processor. The logical operations functional block, and in particular an exclusive OR (XOR) function of the logical operations functional block, may be reused for detected bit error correction. In this manner, several wrong bits, e.g., wrong bits in a data word, may be corrected.

A skilled person will understand that the register may be any register in a processor. For example, the register may be a general purpose register, a register in a vector register file, or any other register. A detection unit may, for example, be adapted to detect and locate bit errors in data words based on checksum information. An ECC correction code syndrome may, for example, be indicative of a location of a wrong bit or wrong bits in a data word, depending on an implemented ECC algorithm. It should be noted that the second input to the multiplexer would normally be allocated as a normal input to conventional logical operations functional block. It should also be appreciated that the techniques disclosed herein may also work with one instead of two input data links.

As used herein, an 'error correction code detection unit' denotes a unit within a processor that is adapted to detect bit errors in registers of the processor. As is used herein, an 'execution unit' or 'functional unit' denotes a part of a central processing unit (CPU). An execution unit performs operations and calculations on data, for example, data words. Closely linked to the execution unit are registers from which the execution unit may fetch data and write results. In some cases, operations may be performed directly on the registers. The term 'processor', as is used herein, may denote a central processing unit (CPU) of a computer in which all necessary functions of the CPU are integrated into a single integrated circuit. In some cases, CPU functions of a processor may be integrated into a single package or implemented on different dies.

As used herein, a 'first input data link' and/or a 'second input data link' may be used to denote two input ports of a functional block, e.g., an XOR functional block or an ALU of a fixed-point unit with different data input ports for different data words, etc. An input data link may be adapted to receive one data byte or several data bytes, e.g., a data word that includes several bytes, e.g., as a data vector, operand, or input 'va' or 'vb'. The term 'data vector' may denote a data word, which may be several bytes wide. The term 'register' may denote a memory within a processor for storing data words. Processor registers may, for example, be implemented as part of a CPU. Typically, an arithmetic and logical unit (ALU) within a processor accesses registers. The term 'look-up table' may denote a memory that delivers a predefined bit pattern based on input addresses for the look-up table.

The term 'error correction code syndrome' may denote information indicative of a mismatch between data in a register and a related ECC memory content and may, for example, be indicative of a location of a wrong bit or alternatively several wrong bits in a data word, depending on the implemented ECC algorithm. For example, a position of a faulty bit or faulty bits may be decoded from the information (e.g., a look-up table may be used for that purpose). The term 'multiplexer', as used herein, denotes a circuit that may switch between two or more different input signals, which may be several bytes wide. An output of the multiplexer may either be connected with one or the other of the two input signals. The switching between inputs may be based on a select signal that may be used to select input signals to be routed to an output of the multiplexer. For example, the select signal may be derived from an instruction of a microprocessor.

As used herein, the term 'vector unit' may denote a functional unit within a processor. A vector unit may perform fixed-point and/or logical operations, e.g., a bit shift operation, an XOR operation, a single bit change operation, etc. A vector unit may perform scalar operations, as well as vector operations, where the difference is mainly in the width of related data. In general terms, the term 'vector unit' may denote an ALU. The term 'general purpose register' may denote a register within a processor with which a CPU may perform any operation, defined by the instruction set of the processor. The term 'vector register file', as used herein, may denote a continuous memory block for storing a series of data words that may, for example, be accessed by a vector unit. The term 'data word' may include a double data word or a quad data word, etc. As used herein, the term 'architected register' may denote registers that may time-wise be in-order of an external instruction flow. Registers that may be out-of-order may be those that do not represent the external instruction flow but may represent a flow of instructions and/or data that may be optimized for an access within a processor.

The term 'data word', as used herein, denotes a series of bits and a data word may be 16, 32, 64, 128, etc. bits wide. Today, a typical data word may have a width of 32 or 64 bits. In this case, a double data word may be 64 or 128 bits long or wide, respectively. As used herein, the term XOR data path may denote a data path within the processor being directed through the XOR part of a logical functional block. The XOR functional block may have an input port and an output port. The input port may be connected to, for example, a vector register file, to deliver data words to be "XORed". At an output port of the XOR functional unit provides "XORed" data that may be further processed by other units or sent to a longer term memory.

In general, a logical operations functional block configured according to the present disclosure may perform an ECC correction with only minimal hardware overhead within the processor and function with a reduced number of staging latches for ECC syndrome transportation and reduced control overhead. A logical operations functional block configured according to the present disclosure typically only requires an additional look-up table and a multiplexer. An existing XOR data-path and control logic may be reused for the purpose of a correction of a data word error indicated by an ECC detection unit, in particular in a register file. It should be appreciated that the disclosed techniques may also be applied to other registers and execution units. The disclosed techniques reduce performance impact to a processor for an ECC correction that are, in general, much less compared to known techniques for data word corrections based on an ECC.

According to one embodiment of an extended logical operations functional block, a select signal for the multiplexer may be based on an instruction of a processor. In this manner, an actual function of a logical operations functional block may be derived from and, thus, linked to an instruction. The logical operations functional block may be implemented as part of a vector unit or as part of a fixed-point unit. In this manner, components of a logical operations functional block of a vector unit may be reused for data word correction based on an ECC, resulting in minimal requirements for error correction at maximum speed. A register may correspond to a general purpose register or any register in a processor. For example, the register may be a register of a vector register file. Thus, the data in the vector register file may be kept correct at any time without interrupting normal operation of a vector unit while maintaining relatively high performance. In general, the correctness of 'in-order' registers have priority.

In one embodiment of the logical operations functional block, the select signal for the multiplexer is a static mode switch that enables error correction code mechanisms. The static mode switch may override a standard decode of an instruction and, thus, enable error correction without assigning an architected or microcode instruction to the ECC correction functionality. In this case, an ECC correction may be performed without additional overhead. According to an embodiment of the invention, a CPU may include a modified logical operations functional block that is used to correct any data error in the processor. According to one or more aspects, execution of instructions of a processor may be suspended at an end of an actual instruction, a correction of data stored in a register may be triggered, and execution of instructions of the processor may be resumed following the data correction. In this manner, an error is usually corrected at the earliest possible time while maintaining integrity of the instruction flow of the processor.

According to one embodiment, the correction of the data word may be achieved using an existing XOR, or logical functional unit of an execution unit of a processor and an XOR data path of the execution unit. In general, existing elements of the processor are reused for additional tasks and, as such, additional overhead costs for error correction are minimized. The correction of a data word may include feeding corrected data bits back to a register. Thus, normal instruction flow may be executed without being disturbed by error detection and correction. The correction of data may be handled based on a microcode routine of the processor. The ECC detection may, in particular, stop the normal operation of the processor, call a microcode routine implemented in microcode that controls information flow for a correction of corrupted data, and then resume normal operation of the processor. During suspension of normal processor operation, the corrupted data may be streamed through the same data flow as if it was a normal XOR instruction and then stored back to the same location in the register file. When the execution of operations is resumed, the data processing unit may find healthy data (i.e., correct data) in the register(s) and thus continue normal operation.

Figure 2:
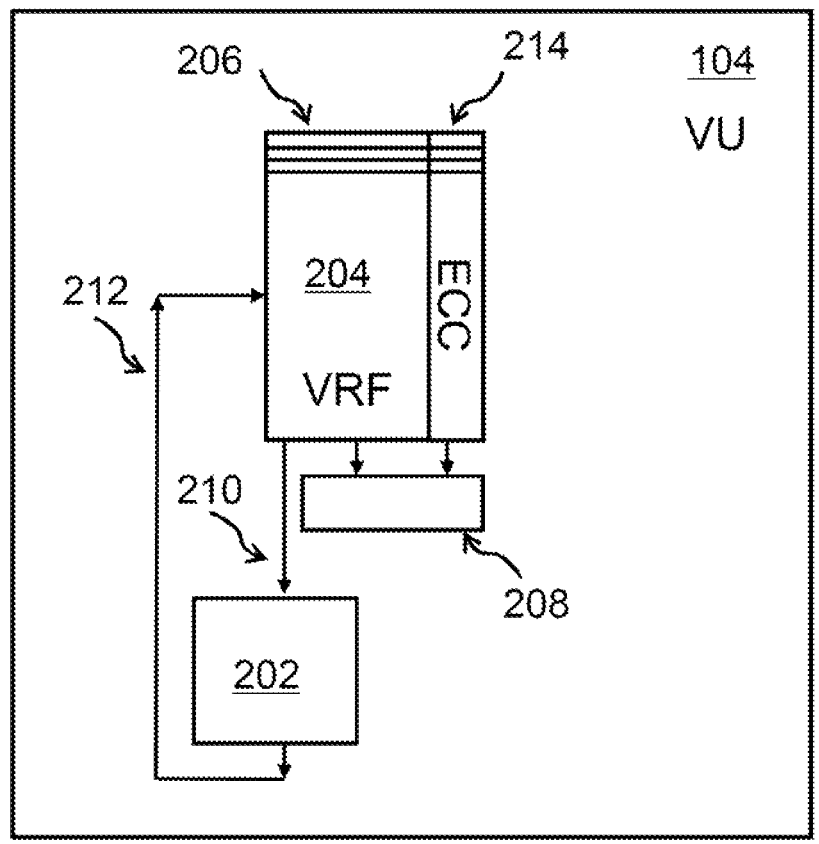
FIG. 2 is a diagram of an exemplary conventional vector unit.

With reference to FIG. 1, a conventional processor core 100 of a processor is illustrated. Core 100 includes at least one load-store unit (LSU) 106 and a plurality of execution units including fixed-point unit (FXU) 102 and a vector unit 104. LSU 106 may fetch data from a memory, via a cache hierarchy, and an execution unit may work on the data. FIG. 2 illustrates elements of vector unit 104. Each word 206 in vector register file (VRF) 204 may include, for example, 64 bits of data. The data may be protected by, for example, an 8-bit ECC signature that is stored for the respective word in an ECC memory unit 214. A data-path 210 leads from the register file 204 to execution logic 202, which implements a logical exclusive OR (XOR) function, among other functions. Two additional data-paths lead from VRF 204 and ECC memory unit 214, respectively, to an ECC detection logic 208 that is capable of performing an ECC calculation on the data and comparing it to the corresponding stored ECC signature, such that it may detect an unintentional change of the data in one or more registers in VRF 204.

A data-path 212 leads from execution logic 202 (also referred to as XOR functional block 202) back to VRF 204 allowing corrected data to be stored back in a memory location of VRF 204. XOR functional block 202 may, for example, be implemented as part of a vector scalar unit that is capable of performing different fixed point operations. A modified XOR functional block may be used (see FIG. 4, 402) that includes three invertors and three multiplexers to implement additional functions in conventional XOR functional block 202. A selection of the function(s) may be controlled by signals derived from operation/instruction code of the processor.

Figure 3:
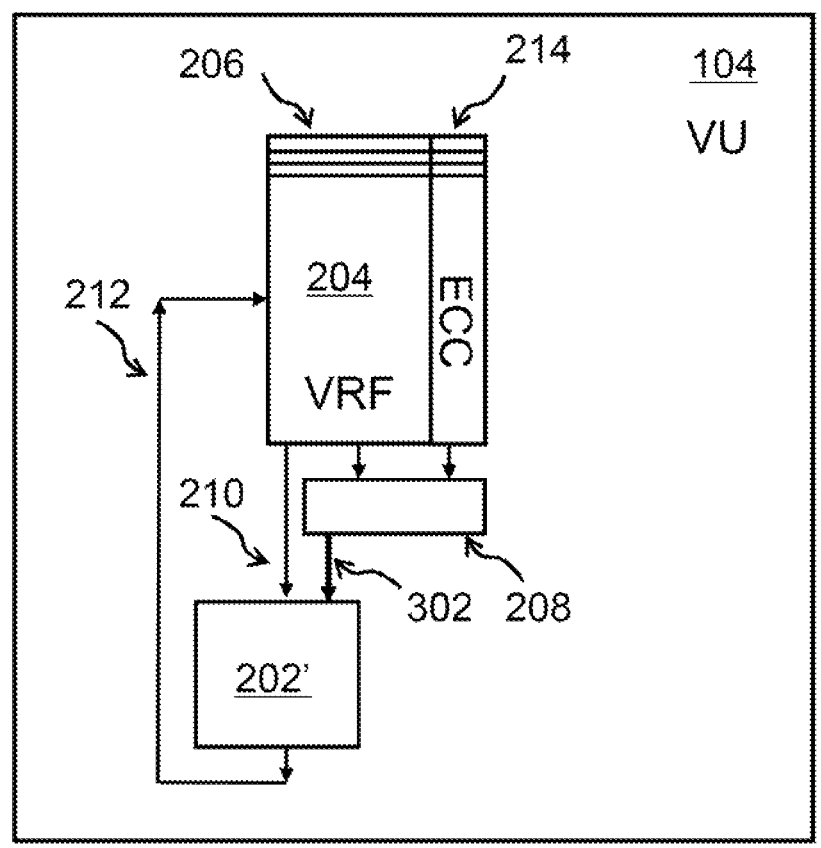
FIG. 3 is a diagram of an exemplary vector unit configured according to an embodiment of the present disclosure.

With reference to FIG. 3 a modified execution unit or logical operations functional block 202' is illustrated. An additional data path 302 is routed from ECC detection unit 208 to modified logical operations functional block 202'. The remaining components may be the same as those illustrated in FIG. 2. A second VRF 204, a second related ECC memory 214, a second ECC detection unit 208, and a second logical operations functional block (or ALU) 202' may be implemented within VU 104 to facilitate operation on longer data words.

Figure 4:
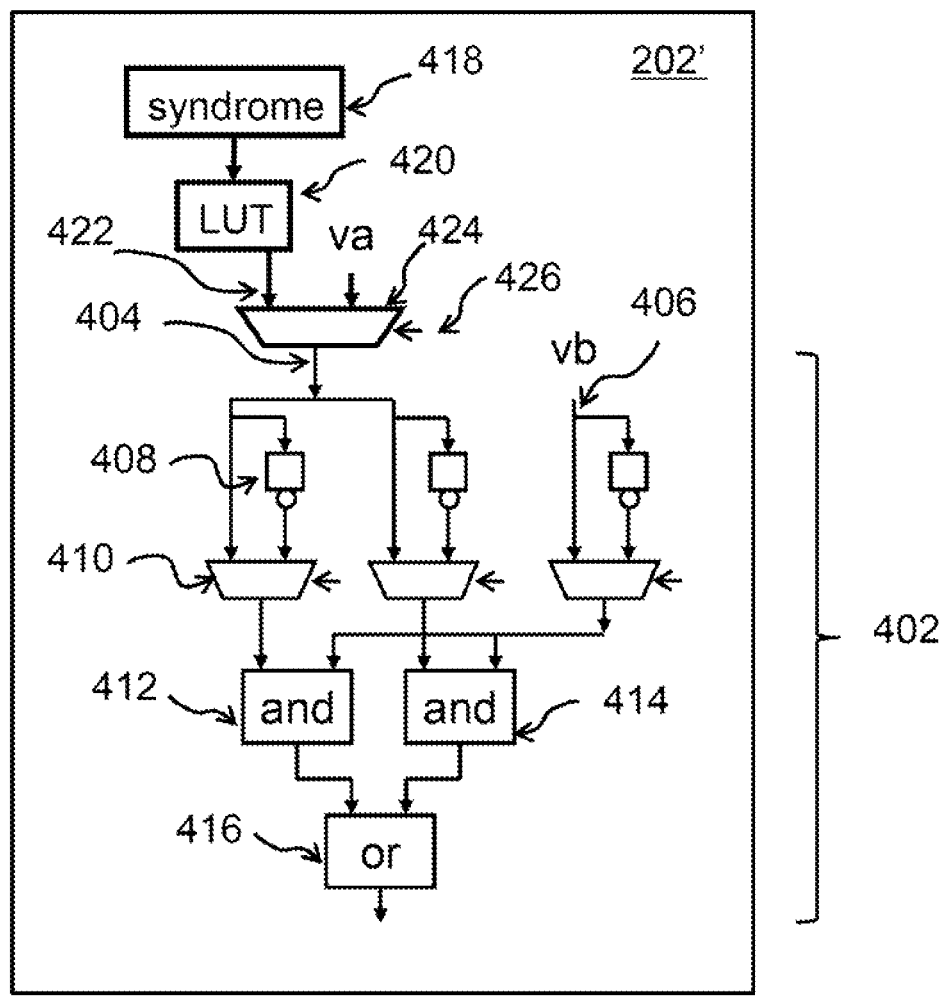
FIG. 4 is a diagram of an exemplary modified logical operations functional block configured according to an embodiment of the present disclosure.

FIG. 4 shows a detailed block diagram of an embodiment of modified logical operations functional block 202'. A conventional XOR scalar unit (or ALU) may include components 402. Two operands or data vectors 'va' and 'vb' may be used as inputs to conventional XOR scalar unit 402. A first data vector 'va', also referred to as first operand, may be input to XOR scalar unit 402 at an input point 404 (also referred to as first input data link 404). A second data vector 'vb', also referred to as second operand, may be directed into XOR scalar unit 402 via a second input data link 406. Conventional XOR scalar unit 402 may include three invertors 408, three multiplexers 410, two AND-gates 412, 414 and an OR-gate 416 wired as indicated. In various embodiments, multiplexers 410 also have a select input for a select signal. The select signal determines which of the input vectors at inputs of multiplexers 410 are passed to outputs of multiplexers 410. In this manner, an expanded XOR function (namely an ALU) may be realized for other bit operations on the operands.

A syndrome-signal 418 (indicative of a bit error) is implemented to address look-up table (LUT) 420. An output signal 422 is generated by LUT 420 and directed to a first input of the multiplexer 424. Output signal 422 is dependent on syndrome-signal 418 (i.e., the error or errors detected in a word of vector register file (VRF) 204), which provides an input to LUT 420. The bit-width of output signal 422 typically corresponds to an allocated word width. A second input of multiplexer 424 receives the normal input vector 'va' for input to XOR scalar unit 402, as is done in the case of a conventional XOR functional block 202. Multiplexer 424 also includes a select signal input 426 for receiving a select signal, which may be derived from an instruction of the CPU in a comparable way as the select signals for the other multiplexers 410 may be generated. LSU 106 includes ECC detection logic in order to compare the ECC signature of a respective data word with a stored ECC signature on a register file read for each register file. If an ECC error is detected, the data word may be sent to LSU 106 via the load-store path and may be repaired using ECC correction logic. In this manner, the logic may be shared across the whole core.

Since the ECC correction may be performed by applying an XOR operation with the data word and a correction vector as input operand, the concept reuses an existing data-path that implements logical operations in an execution unit. The syndrome (e.g., eight bits wide for a 64-bit operand) may be calculated by the ECC detection logic and may include the information to look-up the correction vector in LUT 420. By data-path 302 (FIG. 3) from the ECC detection logic 208 (FIG. 3) to the execution unit or logical operations functional block 202' (FIG. 3) that may carry the syndrome and a look-up table LUT 420 that includes correction vectors, a reuse of data-paths and functional blocks may be enabled. In one or more embodiments, multiplexer 424 is implemented to select whether an input operand or a correction vector is applied as an operand of XOR function block 402 in logical operations functional block 202'. Since wiring and the amount of additional hardware components is generally reduced, implementing the techniques disclosed herein require less components (and correspondingly has reduced costs) as compared to conventional logic for an ECC based data correction.

Figure 5:
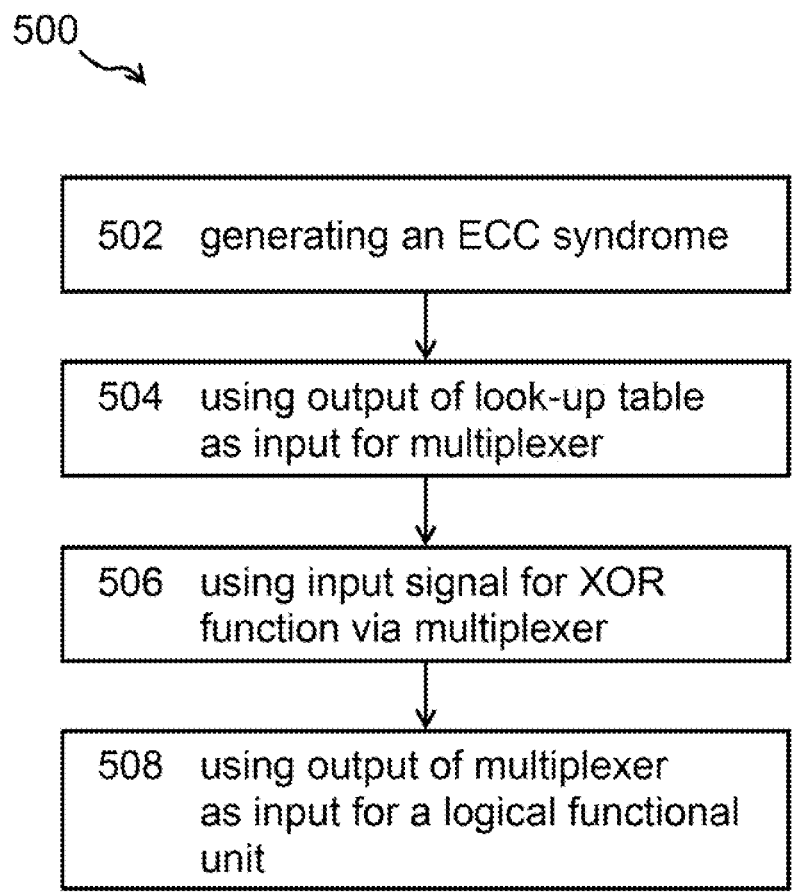
FIG. 5 shows a flowchart of an error correction code (ECC) based correction process according to an embodiment of the present disclosure.

FIG. 5 shows an exemplary process 500 for performing ECC based data correction according to the present disclosure. Process 500 reuses an existing logical operations functional block in an execution unit of a processor for error correction code handling. Process 500 includes generating an error correction logic syndrome as input for a look-up table 502 and using an output of a look-up table as a first input of a multiplexer 504. Additionally, process 500 includes using an input data link allotted for a logical functional unit as second input 'vb' for a multiplexer 506 and using an output of the multiplexer as an input for logical functional unit 508. As noted above, the logical functional unit may already be present in a conventional microprocessor. Advantageously, process 500 reuses at least some components, thereby reducing an amount of additional components required in order to perform ECC based correction of bit errors.

Accordingly, techniques have been disclosed herein that advantageously reuse components of a logical operations functional block in an execution unit of a processor to perform ECC based correction of bit errors.

In the flow charts above, the methods depicted in FIG. 5 may be embodied in a computer-readable medium containing computer-readable code such that a series of steps are performed when the computer-readable code is executed on a computing device. In some implementations, certain steps of the methods may be combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

As will be appreciated by one skilled in the art, aspects of the present invention may be embodied as a system, method or computer program product. Accordingly, aspects of the present invention may take the form of an entirely hardware embodiment or an embodiment combining software and hardware aspects that may all generally be referred to herein as a "circuit," "module" or "system." Furthermore, aspects of the present invention may take the form of a computer program product embodied in one or more computer-readable medium(s) having computer-readable program code embodied thereon.

Any combination of one or more computer-readable medium(s) may be utilized. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing, but does not include a computer-readable signal medium. More specific examples (a non-exhaustive list) of the computer-readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer-readable storage medium may be any tangible storage medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable signal medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be stored in a computer-readable storage medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As will be further appreciated, the processes in embodiments of the present invention may be implemented using any combination of software, firmware or hardware. As a preparatory step to practicing the invention in software, the programming code (whether software or firmware) will typically be stored in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the invention may be practiced by combining one or more machine-readable storage devices containing the code according to the present invention with appropriate processing hardware to execute the code contained therein. An apparatus for practicing the invention could be one or more processing devices and storage subsystems containing or having network access to program(s) coded in accordance with the invention.

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A logical operations functional block for an execution unit of a processor, the logical operations functional block including a first input data link for a first operand and a second input data link for a second operand, wherein the execution unit includes a register connected to an error correction code detection unit, the logical operations functional block comprising:
   a look-up table configured to receive an error correction code syndrome from the error correction code detection unit, wherein the error correction code syndrome indicates a mismatch between data in the register and a related error correction code memory, and wherein the error correction code syndrome indicates a location of one or more wrong bits in a data word; and
   a multiplexer configured to receive an output signal from the look-up table at a first input and the first operand at a second input, wherein the multiplexer further comprises a select signal input for receiving a select signal;
   wherein the input of the look-up table is connected to an output of the error correction code detection unit, wherein an output of the look-up table is coupled to the first input of the multiplexer, and wherein an output of the multiplexer is coupled to the first input data link of a logical functional unit.

2. The logical operations functional block of claim 1, wherein a select signal for the multiplexer is based on an instruction of the processor.

3. The logical operations functional block of claim 1, wherein the logical operations functional block is implemented as part of a vector unit.

4. The logical operations functional block of claim 1, wherein the register is a general purpose register.

5. The logical operations functional block of claim 1, wherein the register is a register of a vector register file.

6. The logical operations functional block of claim 1, wherein the register is an architected register.

7. The logical operations functional block of claim 1, wherein a select signal for the multiplexer is a static mode switch that enables error correction code mechanisms.

8. A processor comprising:
a memory; and
a logical operations functional block for an execution unit, the logical operations functional block including a first input data link and a second input data link for a first operand and a second operand, respectively, wherein the execution unit includes a register coupled to an error correction code detection unit, the logical operations functional block comprising:
a look-up table configured to receive an error correction code syndrome from the error correction code detection unit, wherein the error correction code syndrome indicates a mismatch between data in the register and a related error correction code memory, and wherein the error correction code syndrome indicates a location of one or more wrong bits in a data word; and
a multiplexer configured to receive an output signal from the look-up table at a first input and the first operand at a second input, wherein the multiplexer further comprises a select signal input for receiving a select signal;
wherein the input of the look-up table is connected to an output of the error correction code detection unit, wherein an output of the look-up table is coupled to the first input of the multiplexer, and wherein an output of the multiplexer is connected to the first input data link of a logical functional unit.

9. The processor of claim 8, wherein a select signal for the multiplexer is based on an instruction of the processor.

10. The processor of claim 8, wherein the logical operations functional block is implemented as part of a vector unit.

11. The processor of claim 8, wherein the register is a general purpose register.

12. The processor of claim 8, wherein the register is a register of a vector register file.

13. The processor of claim 8, wherein the register is an architected register.

14. The processor of claim 8, wherein a select signal for the multiplexer is a static mode switch enabling error correction code mechanisms.

15. A method of operating a logical operations functional block in an execution unit of a processor for error correction code handling, the execution unit including a register, the method comprising:
generating, at an error correction code detection unit, an error correction logic syndrome as an input for a look-up table, wherein the error correction code syndrome indicates a mismatch between data in the register and a related error correction code memory, and wherein the error correction code syndrome indicates a location of one or more wrong bits in a data word;
providing an output signal from an output of the look-up table to a first input of a multiplexer;
providing an input data link of the logical operations functional block to a second input of the multiplexer; and
providing the output of the multiplexer as an input for a logical functional unit;
wherein the multiplexer further comprises a select signal input for receiving a select signal, wherein the input of the look-up table is connected to an output of the error correction code detection unit, wherein the output of the look-up table is coupled to the first input of the multiplexer.

16. The method of claim 15, further comprising:
suspending execution of instructions of the processor at an end of an actual instruction;
triggering a correction of an operand stored in the register based on the error code correction syndrome; and
resuming the execution of instructions of the processor subsequent to the correction of the operand stored in the register.

17. The method of claim 16, wherein the correction of the operand comprises using the logical operations functional block of the execution unit and an XOR data path of the execution unit.

18. The method of claim 16, wherein the correction of the operand comprises feeding corrected data back to the register.

19. The method of claim 16, wherein the correction of the operand is handled based on a microcode routine of the processor.

20. The method of claim 16, wherein the register is a general purpose register.

\* \* \* \* \*